US 6,773,936 B2

(12) United States Patent
Fujiwara et al.

(10) Patent No.: US 6,773,936 B2
(45) Date of Patent: Aug. 10, 2004

(54) METHOD OF REDUCING LOW-FREQUENCY NOISE FOR SEMICONDUCTOR DEVICES AND CIRCUITS

(75) Inventors: Mikio Fujiwara, Tokyo (JP); Makoto Akiba, Tokyo (JP)

(73) Assignee: Communications Research Laboratory, Independent Administrative Institution, Tokyo (JP)

( * ) Notice: Subject to any disclaimer, the term of this patent is extended or adjusted under 35 U.S.C. 154(b) by 17 days.

(21) Appl. No.: 10/235,581

(22) Filed: Sep. 6, 2002

(65) Prior Publication Data

US 2003/0087508 A1 May 8, 2003

(30) Foreign Application Priority Data

Nov. 8, 2001 (JP) ........................................ 2001-342633

(51) Int. Cl.[7] .............................................. H01L 21/66
(52) U.S. Cl. .......................................... 438/14; 438/122
(58) Field of Search ............................ 438/14, 26, 122, 438/308

(56) References Cited

PUBLICATIONS

Japan Society of Applied Physics The 62nd Autumn Meeting, 2001, Abstract 13p–ZF–6 "Low–Frequency Noise Reducing Method for GaAsJ–FET at a Cryogenic Temperature", M. Fujiwara et al.; Communications Research Laboratory.

Applied Physics Letters, vol. 80, No. 10, Mar. 11, 2002, pp. 1844–1846, "Reduction Method For Low–Frequency Noise of GaAs Junction Field–Effect Transistor at a Cryogenic Temperature," M. Fujiwara et al.; Communications Research Laboratory.

*Primary Examiner*—H. Jey Tsai

(57) ABSTRACT

The present invention relates to a method for reducing low-frequency noise in a cooled circuit wherein low-frequency noise in a cryogenic semiconductor device is reduced by carrying out thermal cure. The semiconductor device is turned on at a first temperature, and the temperature of the semiconductor device is temporarily raised, while flowing current in the semiconductor device, to a second temperature that is higher than the first temperature, and then cooling the temperature of the semiconductor device from the second temperature to a cryogenic temperature, at which the semiconductor device can operate.

11 Claims, 20 Drawing Sheets

I-V CHARACTERISTICS OF GaAs J-FET
AT ROOM TEMPERATURE gm-VG CHARACTERISTICS OF GaAs J-FET
AT ROOM TEMPERATURE

I-V CHARACTERISTICS OF GaAs J-FET
AT 77K gm-VG CHARACTERISTICS OF GaAs J-FET
AT A TEMPERATURE OF 77K gm-VG CHARACTERISTICS OF GaAs J-FET
AT A TEMPERATURE OF 4.2K

CAPACITANCE AS A FUNCTION OF GATE VOLTAGE

NOISE SPECTRUM OF THE GaAs JFET
BOTH BEFORE AND AFTER TC

TIME (HOUR)
NOISE STABILITY

DEPENDENCY ON CURE TEMPERATURE
OF NOISE AT A TEMPERATURE OF 4.2K AT 1Hz

BEFORE THERMAL CURE

AFTER THERMAL CURE

METHOD OF REDUCING LOW-FREQUENCY NOISE FOR SEMICONDUCTOR DEVICES AND CIRCUITS

CROSS REFERENCE TO RELATED APPLICATIONS

This application claims priority Japanese Patent Application No. 2001-342633, filed Nov. 8, 2001 in Japan, the contents of which are incorporated herein by reference.

BACKGROUND OF THE INVENTION

1. Field of the Invention

The present invention relates generally to method of reducing low-frequency noise for semiconductor devices and circuits. The circuits contains cryogenic transistors that operate at a cryogenic temperature are housed in a cryostat, the cooling temperature of which is adjustable. Moreover the present invention relates specifically to a method of reducing low-frequency noise in transistors used in cooled readout circuits that are used for high-sensitivity, high-resistance cryogenic photodetectors.

2. Description of the Related Art

The related art is as follows. Heretofore, cryogenic field effect transistors (FETs) have been used as electronics of trans-impedance devices for feeble light sensors. FETs (GaAs junctin FETs, for example) used in the circuits at cryogenic temperature tend to cause low-frequency noise that adversely affects the performance of the readout circuit for the photodetectors. Now, random telegraph signals (RTS) when a GaAs junction FET (JFET) is operated at cryogenic temperatures are explained in the following.

FIGS. 20A and 20B are drawings to explain problems in the related art. FIG. 20A illustrates an output waveform of GaAs J-FET and FIG. 20B illustrates the temperature dependence of the noise spectra. In FIG. 20A, the abscissa represents time (sec) and the ordinate represents the output ×$10^2$ (V). FIG. 20A shows a noise output in a certain range of time under a steady state. In FIG. 20B, the abscissa represents the frequency (Hz) and the ordinate represents the gate input referred noise spectrum (dBV/Hz$^{1/2}$). The V/Hz$^{1/2}$ mentioned above is equal to V/Hz, and this applies to the following description throughout. Some sharp signals of the noise found in FIG. 20A are RTSs. Note that sharp three peaks appearing in the vicinity of 20–70 Hz in FIG. 20B are power noise that are different from the RTS noise with which the present invention is concerned.

The RTS is a discrete conductance fluctuation found in the operation of a solid-state device. The RTS is characterized in that its spectra closely resemble those of Generation-Recombination noise (G-R noise), however the amount of its conductance fluctuations is constant, which is different from the G-R noise. Owing to the constant fluctuation of its conductance, the RTS is generally considered that it is caused from switching (or transition) of a single electron to a trap level, but its detailed physical process is not yet to be elucidated. The switching of a single electron to a trap level affects to total currents of the transistor so as to be modulated with the trap level whether the trap is occupied with an electron or not.

The RTS was reported occurring in metal-oxide-semiconductor FETs (MOSFET), J-FETS, Quantum Well Infrared Photoconductors (QWIPs), bipolar pn-junction transistors, etc. of various structures and materials, or under various operating conditions (refer to K. Kandiah IEEE Trans. Electron Devices, vol. 41, p. 2006, 1994, for example.)

The RTS might cause serious deterioration of performance when FETs are used in a readout circuit in a high-sensitivity sensor where the system performance is limited by low-frequency noise. The static characteristics of GaAs J-FETs and the dependence of noise on their operating conditions were investigated in a temperature range of 2K~77K (K: Kelvin). The results are as follows:

The typical gate size of the FETs used was W/L=5 $\mu$m /50 $\mu$m (W: width, L: length). It can be concluded from the noise spectra and output waveforms measured at various operating voltages that the low-frequency noise generated under the cryogenic condition of GaAs J-FETs are noise predominantly caused from the RTS noise. In FIG. 20B, Lorentzian spectra are seen, and it can be observed that the cutoff frequency increase as the operating temperature rises over 40K, while independent of the operating temperature between 4.2 and 20K.

FIG. 20A shows an output waveform at 4.2K of a GaAs J-FET when operated in a saturation region of VD (drain-source voltage)=0.7 5V and VG (gate voltage)=0.32V. FIG. 20B shows the temperature dependence of noise spectra in the same FET when operated under the same voltage conditions. The drain current in this case is 2.4 $\mu$A.

On the basis of the wave height in FIG. 20A, the amount of discrete current variation can be estimated at 1.5 nA, which amounts to about $\frac{1}{1000}$ of the entire current. As can be seen in FIG. 20B, the incidence rate of RTSs varies depending on temperature, while little changes can be observed in the variance of carrier residence time in the trap. That is, at temperatures above 45K or more than 45K, noise spectra show temperature dependence, and the Lorentzian noise spectrum shifts to the higher-frequency side with increases in temperature. In other words, the process of electron transition to the trap level causing RTSs is dominated by thermal fluctuations in the vicinity of 45K or higher.

SUMMARY OF THE INVENTION

The aforementioned prior art has the following problem. As described earlier, it was concluded that low-frequency noise in a GaAs J-FET at cryogenic temperatures are dominated by noise arising from RTSs. The RTS may cause serious deterioration of performance when FETs are used in the readout circuit of a high-sensitivity sensor where low-frequency noise may limit system performance. An object of the present invention is to solve the aforementioned problems with the prior art and to reduce low-frequency noise in cryogenic semiconductor devices.

To achieve the aforementioned objectives, the present invention has a following method. In a method for reducing low-frequency noise in a cooled readout circuit where a cryogenic transistor is housed in a cryostat the cooling temperature of which is adjustable, as a first step, the transistor is put into the operating state at a first temperature by turning on the power. If RTSs are seen in the output waveforms, the temperature of the transistor is raised to higher than the first temperature, while flowing current in the semiconductor device. As the second step, the temperature of the transistor is cooled down from the second temperature to a cryogenic temperature again. Upon completion of the second step, the transistor is operated at the cryogenic temperature as the third step. In this way, the present invention reduces the low-frequency noise.

Another aspect of the present invention is in the following. In a method for reducing low-frequency noise in a semiconductor device operating in a cryogenic temperature, as a first step, a semiconductor device is turned on at a cryogenic temperature, and the temperature of the semiconductor device is temporarily raised to a second temperature that is higher than the first temperature, while flowing current in the semiconductor device. Following the first step, as a second step, the semiconductor device is cooled from the second temperature to a cryogenic temperature again. The transistor is operated at the cryogenic temperature.

The objects, advantages and features of the present invention will be more clearly understood by reference to the following detailed disclosure and the accompanying drawings.

DETAILED DESCRIPTION OF THE PREFERRED EMBODIMENTS

Figure 1:
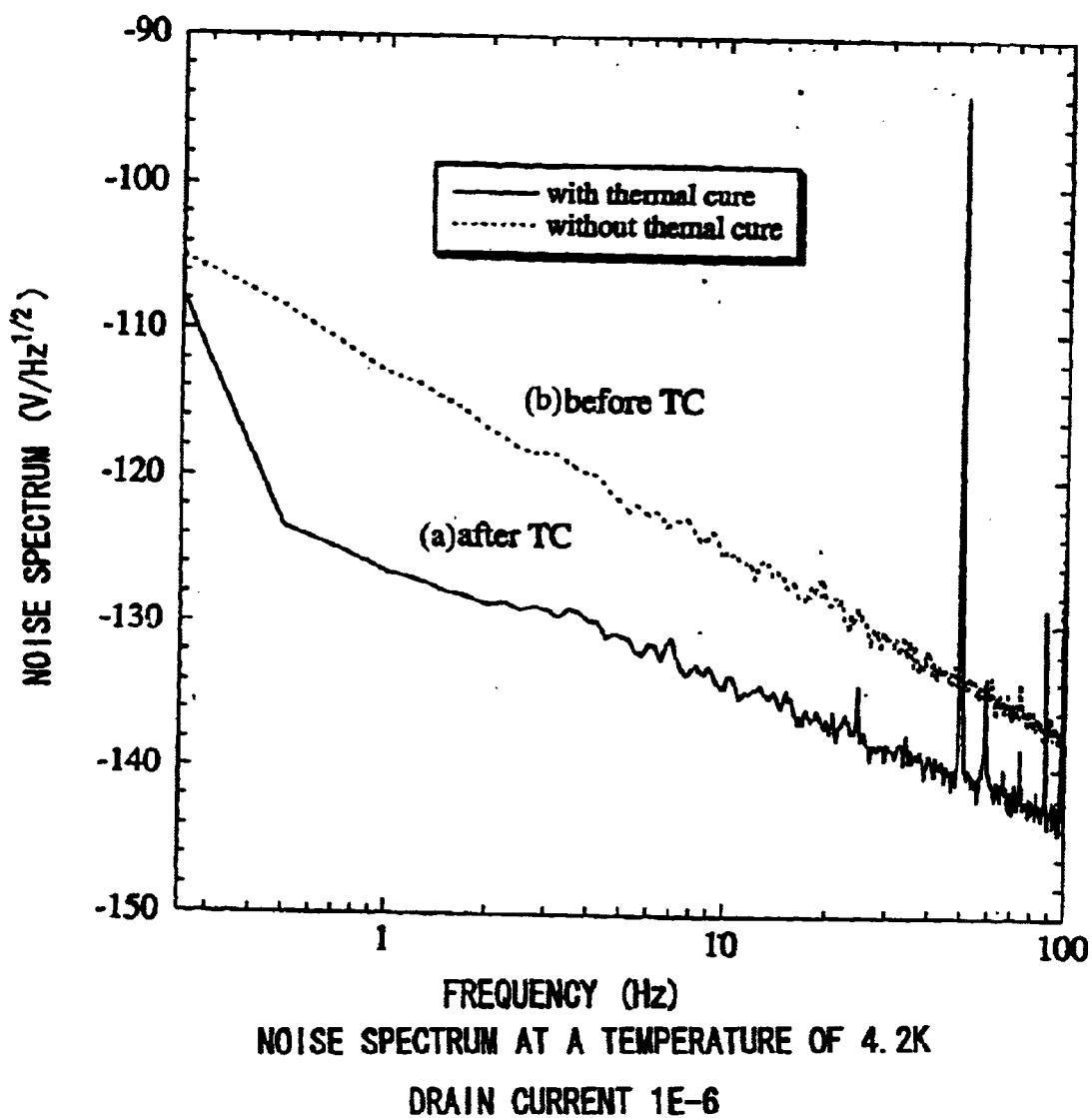
FIG. 1 shows noise spectrum in cases with thermal cure and without thermal cure in an embodiment of the present invention.

In the following, preferred embodiments of the present invention will be described in detail by referring to the accompanying drawings. To begin with, a method for reducing low-frequency noise in a cryogenic GaAs J-FET will be described. FIG. 1 shows noise levels in the transistor with the thermal cure and without the thermal cure, where the drain current is 1 $\mu$A. In FIG. 1, the abscissa represents the frequency (Hz) and the ordinate represents the noise spectrum (dBV/Hz$^{1/2}$). An outline of the method for reducing low-frequency noise in a cryogenic GaAs J-FET is described by reference to FIG. 1. In FIG. 1, (a) shows a case where the thermal cure in the present invention was carried out on the transistor (referred as after TC in FIG. 1), which shows the noise level lowers at the rate of almost 1/f with increases in frequency, while (b) shows a case where no thermal cure was carried out ( referred as before TC in FIG. 1), which shows the noise level lowers at the rate of almost 1/f$^2$ with the increases of frequency.

The GaAs J-FET is expected to be applied to a readout circuit in a high sensitivity and resistance photo-detector operating in a cryogenic temperature since it can be operated as a transistor at temperatures lower than 4.2 K and is characterized by low capacitance and low gate leak current. Since this high-sensitivity, high-resistance photo-detector is designed to detect feeble light by integrating the output charges obtained in the measurement of the light, the performance of the readout circuit is limited by low-frequency noise.

Noise predominant in the low-frequency range (0.1~1000 Hz) are flicker noise such as 1/f, G-R and RTS noise. The present inventors have found out through experiments that low-frequency noise can be reduced by temporarily rising the operating temperature.

In the experiments, a GaAs J-FET manufactured by SONY Corp. was used as a test sample. The gate size of the GaAs J-FET is length L of 50 $\mu$m and width W of 5 $\mu$m. Taking into account the actually used conditions where power consumption is very small, noise at the low drain current of about 1~2 $\mu$A should be reduced. To meet such a requirement, the operating voltage is 0.5 V in VD (drain to source voltage) and 0.22 V in VG (gate voltage), and the normal operating temperature is 4.2 K.

When a voltage is applied to an FET at the liquid helium temperature, the noise was 2 $\mu$V/Hz$^{1/2}$ at 1 Hz, and was further reduced to 1.25 $\mu$V/Hz$^{1/2}$ after left as it is for 4 hours, but no changes were observed thereafter.

When power was turned on, and the operating temperature was raised to 55 K (ramp rate of 20 K/min) and then cooled to 4.2 K, the noise fell to 0.5 $\mu$V/Hz$^{1/2}$. It was found that the noise level remained unchanged even after letting the FET left as it is for six hours, and that the drain current of 1~2 $\mu$A was controlled by changing the gate voltage while keeping the noise at a low level.

The experiment shows that the low noise was accomplished not because the noise characteristics were changed by a temporary rise of the transistor temperature, but because the temperature rise caused a physical change in the noise source in the transistor. The experiment also revealed that the noise was reduced to a very low level by almost half even when compared with the p-MOSFET used in satellite onboard equipment as a cryogenic readout circuit (refer to M. Noda et al.: Proc. SPIE3325 (1988) 247.)

Now, the cryogenic operating performance of the transistor will be described in detail referring FIG. 2–FIG. 15. FIGS. 2–15 are drawings explaining the cryogenic operating performance of the transistor. In the following, the cryogenic operating performance of the transistor is described in detail by reference to these drawings.

(1) Outline of Cryogenic Operating Performance of Transistor

The feeble light sensor has to be cooled to low temperatures so as to reduce leak currents and thermally excited currents. Cooling to the liquid helium temperature is essential not only for mid-infrared and far-infrared sensors where thermally excited currents are predominant, but also for near-infrared sensors that are composed of compound semiconductors so as to lower the hopping current that is a dark current.

The photo-detector needs an impedance converting element because of its high impedance. Si J-FETs (silicon junction FETs) which have low noise in the low-frequency range (a few dozens of $nV/Hz^{1/2}$ at 1 Hz) have heretofore been widely used as impedance converting elements. With the Si J-FET, however, the "carrier freezing" occurs at temperatures lower than 60 K, so the readout circuit has to be installed on a separate stage heated up to 77 K, and a high impedance wiring between the stages with temperature deference of the sensor and the readout circuit is necessary.

This type of wiring, however, is sensible for thermal influx or external noise, and the sensibility of the wiring obstructs to improve the performance of detecting systems or make such systems big. Astronomical observation is a typical application of feeble light sensing. With developments of satellites for infrared astronomy which are carried out in various countries in the world, cryogenic FETs are being developed in various research institutions.

At present, mainstream cryogenic FETs are p-MOSFETs. Although cryogenic FETs of this type have features relatively less nonlinear phenomena, such as kink and hysteresis, and their noise level is within the allowable range, they do not necessarily have satisfactory performances. Compound semiconductor transistors have potential for cryogenically operable FETs due to their small effective carrier mass.

Metal epitaxial semiconductor FETs (MESFETs) or high electron mobility transistors (HEMTs), however, cannot be used as high-sensitivity photo-detecting system due to their high gate leaks. J-FETs having a p-n junction on the gate, on the other hand, have a possibility of reducing leak currents.

The present inventor has worked on the development of the technology of cryogenic reading out circuits using the "D-mode n-type GaAs J-FET GD-001," which is a transistor manufactured by SONY Corporation, as a sample transistor. The results of performance assessment of this sample transistor are described in the following.

(2) Measuring Method

Measurement was taken using "PPMS" which is a cooling system manufactured by Quantum Design. This cooling system is capable of cooling the element temperature from room temperature down to 2 K. The circuit used in the measurement is shown in FIG. 2.

Figure 2:
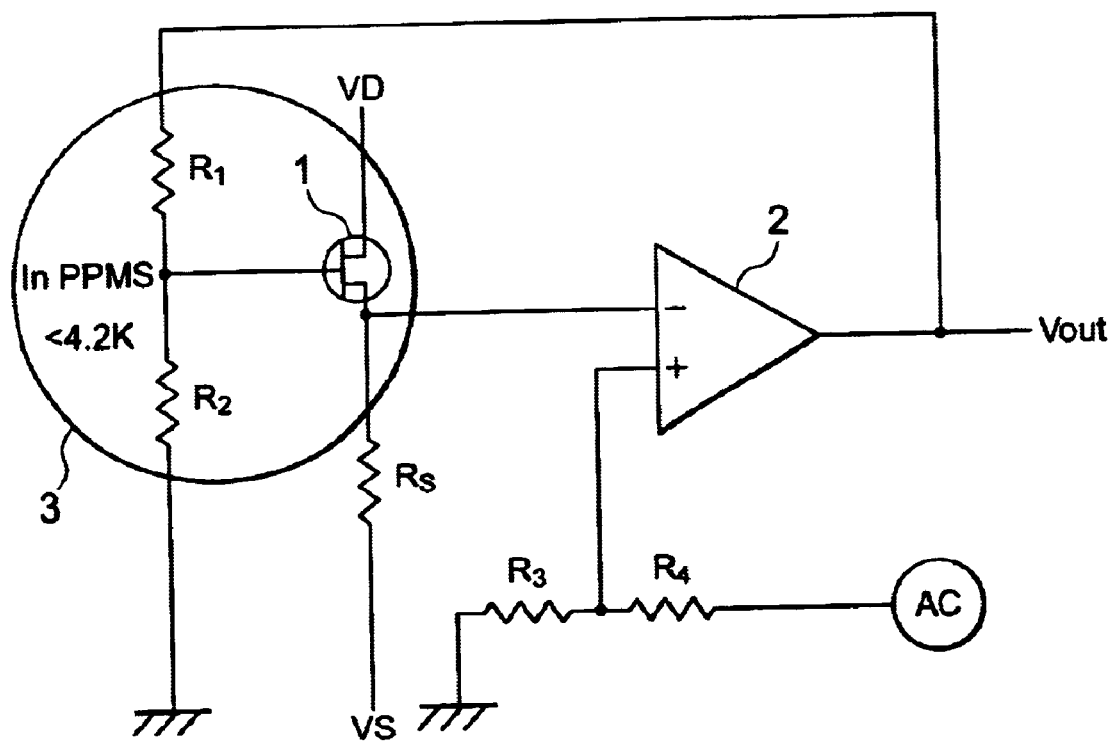
FIG. 2 shows a noise measuring circuit in an embodiment of the present invention.

In the noise measuring circuit shown in FIG. 2, numeral 1 denotes a GaAs J-FET (sample transistor), 2 denotes an operational amplifier (OP-amp), 3 denotes a PPMS, $R_1$, $R_2$, $R_3$, $R_4$ and $R_s$ are resistors, VD is a drain voltage; VS is a source voltage, $V_{out}$ is an output terminal, respectively.

In the circuit shown in FIG. 2, the output terminal $V_{out}$ of the operational amplifier 2, whose gain is ten-fold, is further connected to a low-noise amplifier (normal gain of 10-fold) manufactured by Stanford Microdevices. Noise measurement was conducted by using the "R9211BFET servo-analyzer" manufactured by Advantest.

The measurement was implemented with the GaAs J-FET 1 housed in the PPMS 3 with the GaAs J-FET 1 covered with a metallic hermetic seal. The I-V curve (current-voltage characteristics) was measured using an HP4577 semiconductor parameter analyzer.

(3) Measurement Results (i) I-V Measurement

Figure 3:
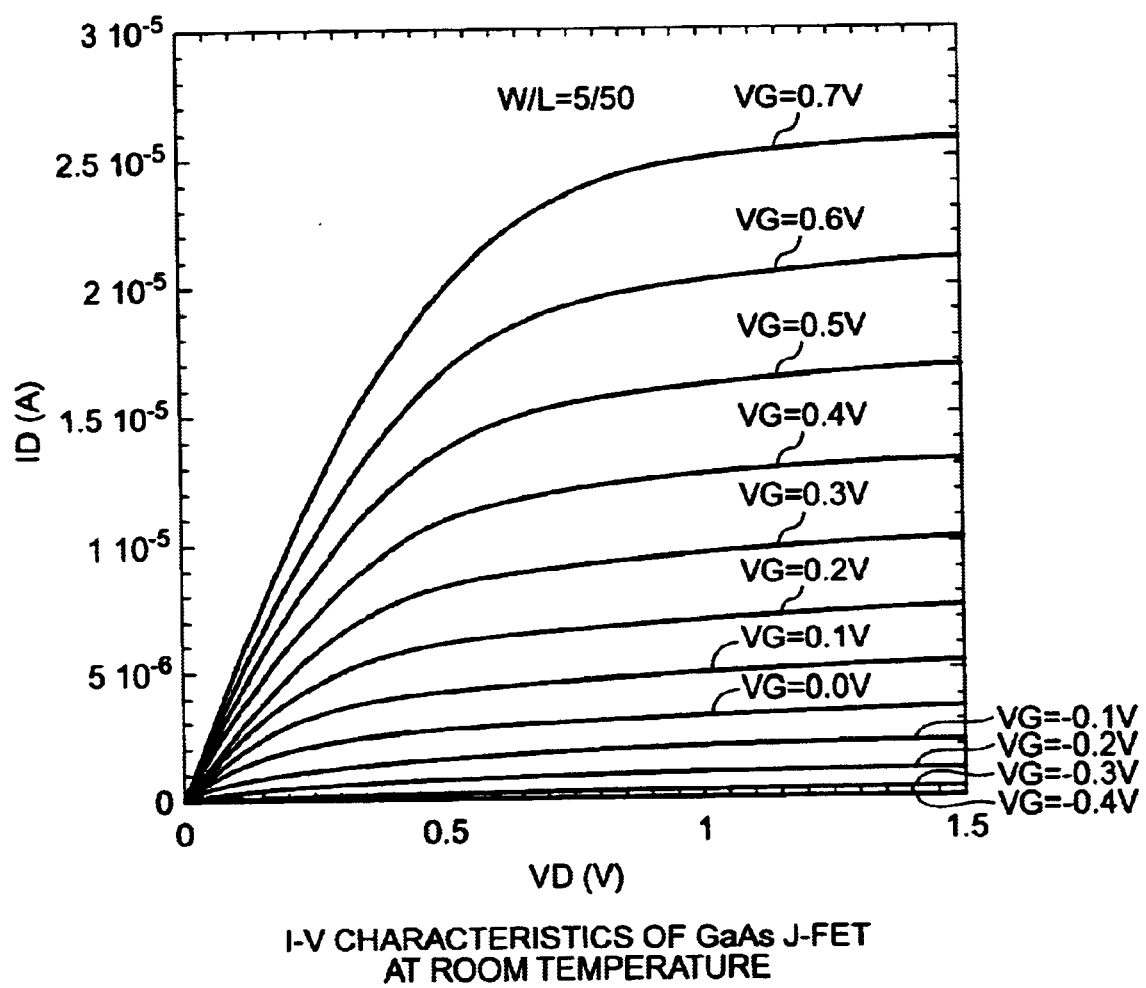
FIG. 3 shows a static characteristic of ID-VG at room temperature in an embodiment of the present invention.
Figure 4:
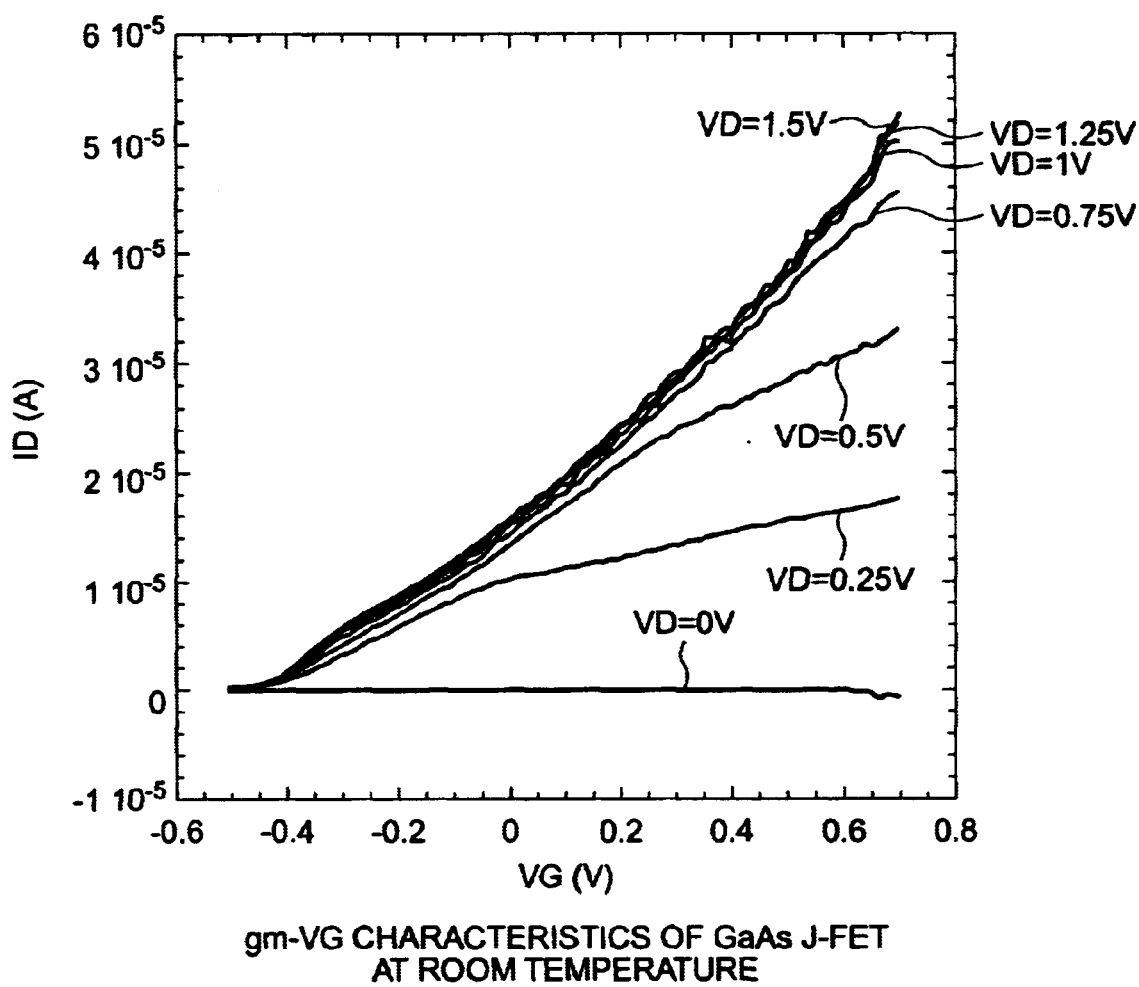
FIG. 4 shows another static characteristic of gm-VG at room temperature in an embodiment of the present invention.

FIG. 3 shows the static characteristics at room temperature, which is I-V characteristics with the abscissa representing VD (drain voltage) (V) and the ordinate ID (drain current) (A). FIG. 4 shows the static characteristics at room temperature, which is gm-VG characteristics with the abscissa representing VG (gate voltage) (V) and the ordinate representing gm (S) where gm is mutual conductance and S refers to siemens.

Figure 5:
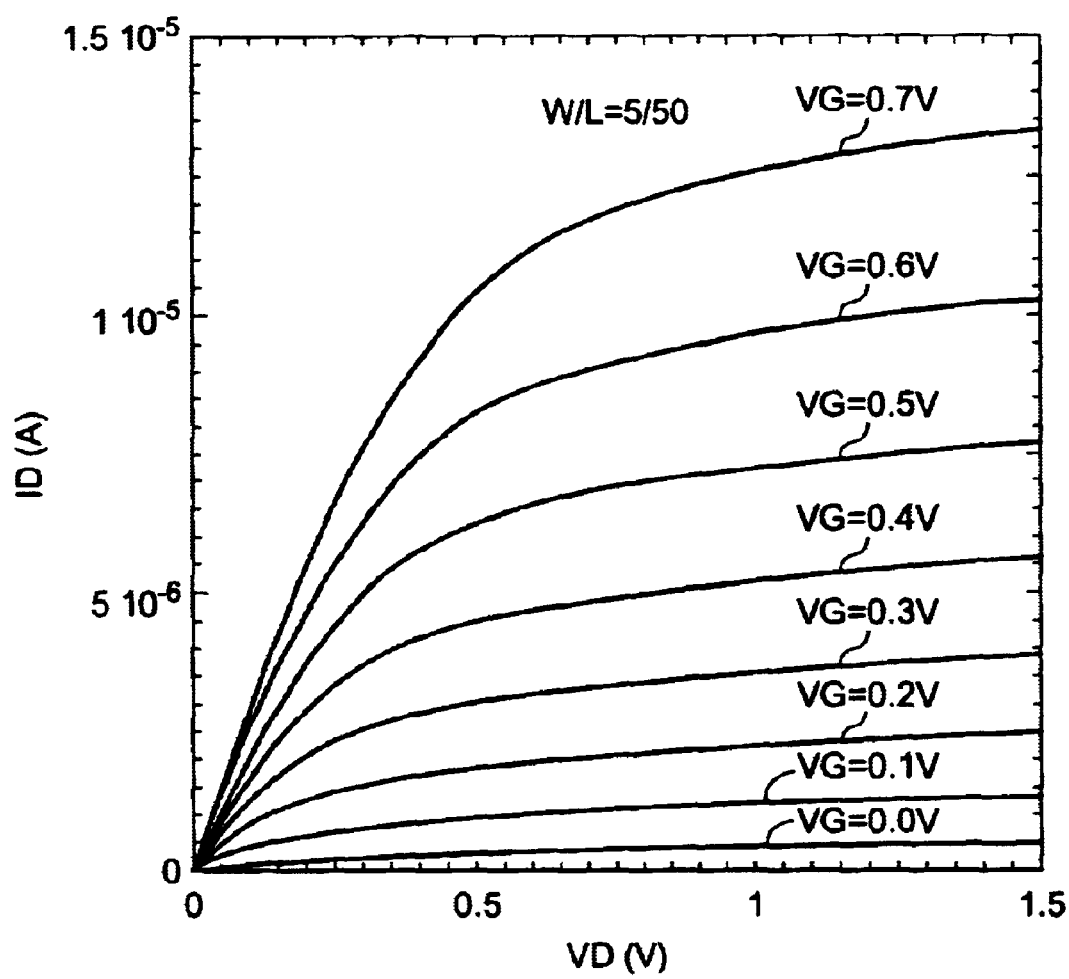
FIG. 5 shows a static characteristic of ID-VD at liquid-nitrogen temperature in an embodiment of the present invention.
Figure 6:
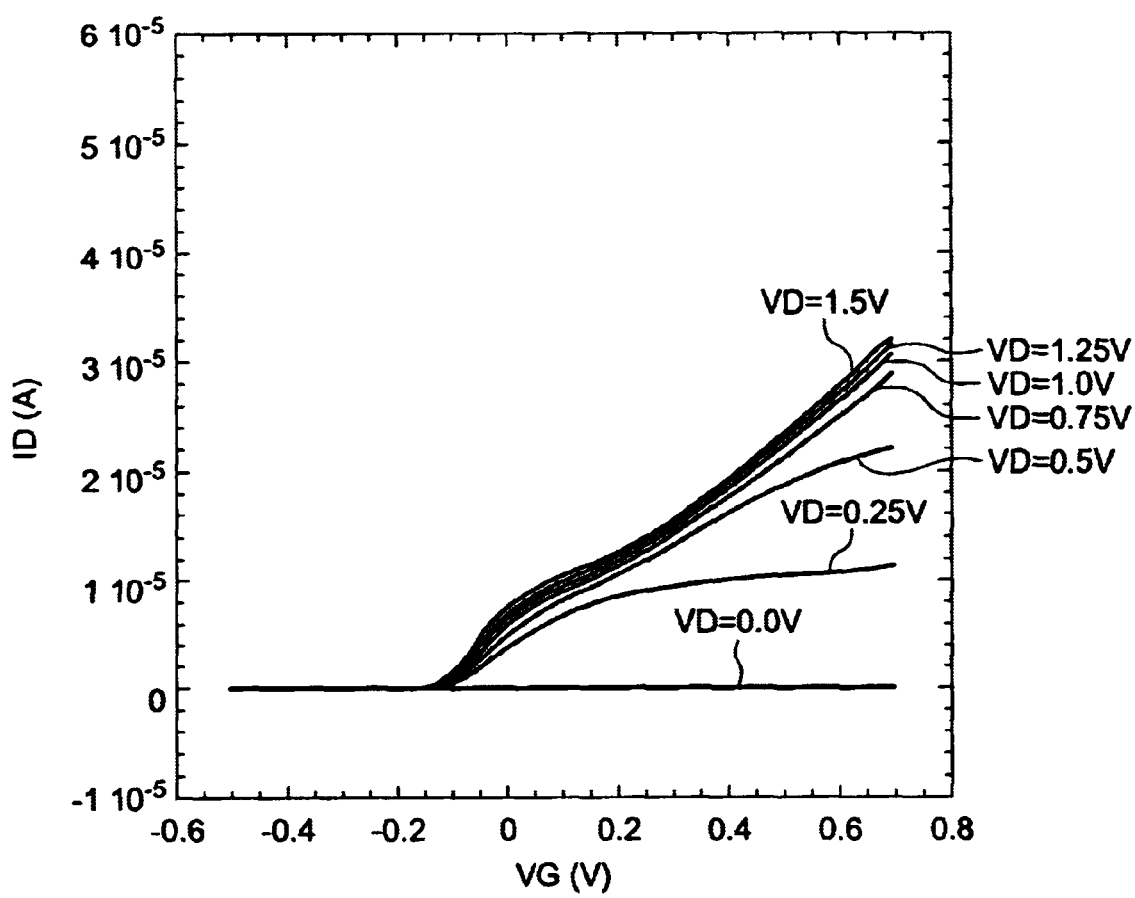
FIG. 6 shows a static characteristic of gm-VG at liquid-nitrogen temperature in an embodiment of the present invention.
Figure 7:
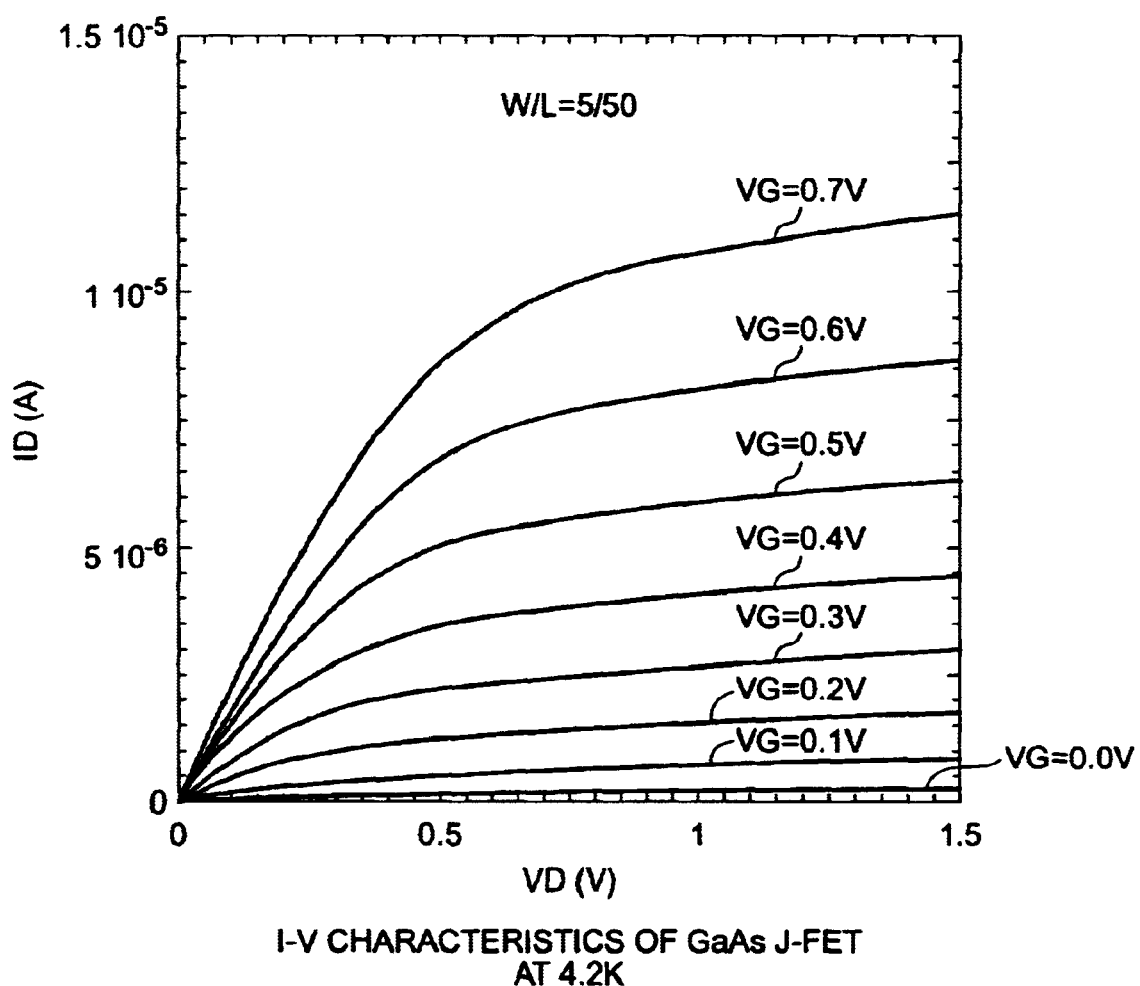
FIG. 7 shows a static characteristic ID-VD at liquid-helium temperature in an embodiment of the present invention.
Figure 8:
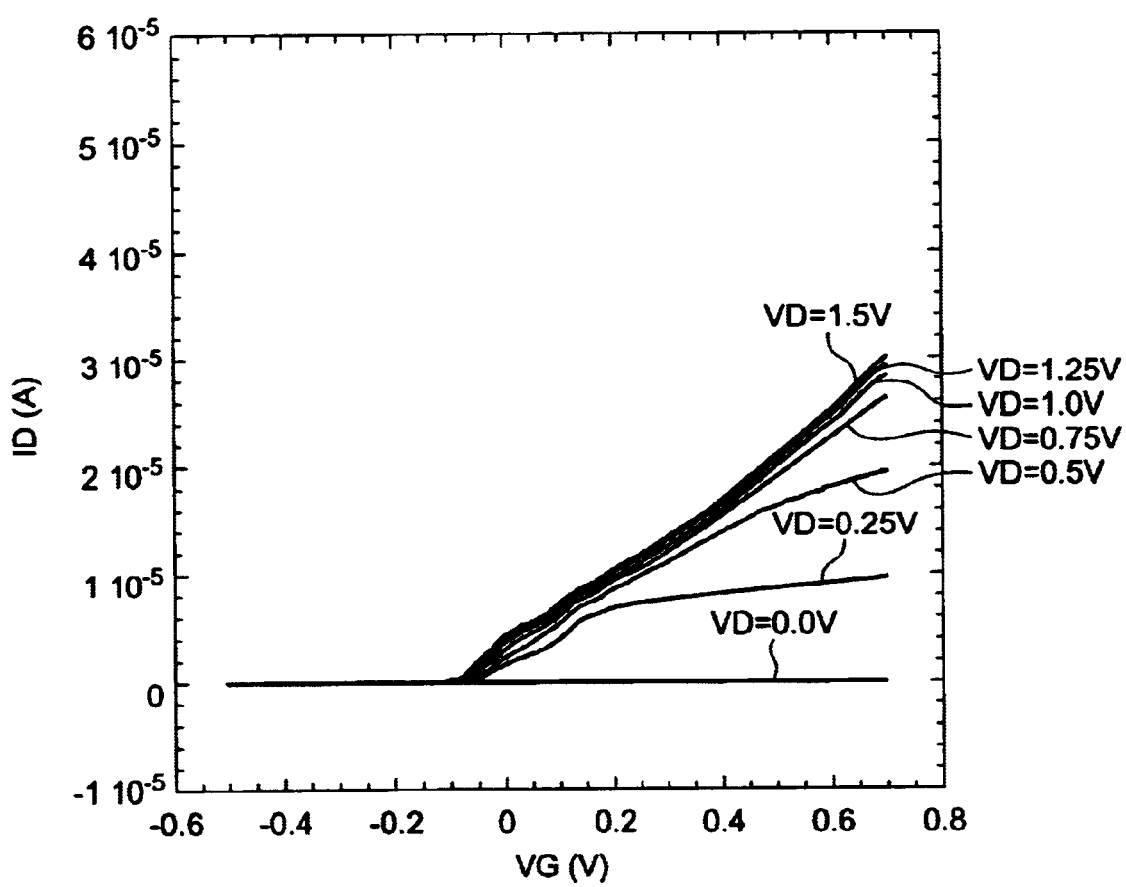
FIG. 8 shows a static characteristic of gm-VG at liquid-helium temperature in an embodiment of the present invention.

FIG. 5 shows the static characteristics at the liquid nitrogen temperature of 77K, which is I-V characteristics with the abscissa representing VD (V) and the ordinate ID (A). FIG. 6 shows the static characteristics at the liquid nitrogen temperature of 77K, which is gm-VG characteristics with the abscissa representing VG (V) and the ordinate gm (S). FIG. 7 shows the static characteristics at the liquid helium temperature of 4.2K, which is I-V characteristics with the abscissa representing VD (V) and the ordinate ID (A). FIG. 8 shows the static characteristics at the liquid helium temperature of 4.2K, which is gm-characteristics with the abscissa representing VG (V) and the ordinate representing gm (S).

The characteristics shown in FIGS. 3, 4, 5, 6, 7 and 8 were measured using a FET whose gate size is width W of 5 $\mu$m and length L of 50 $\mu$m. The transistor was of a D (depletion) type at the room temperature, and the threshold value was changed with lowering of the operating temperature. The threshold value was in the vicinity of –100 mV at 4.2 K. The operating temperature lowering, both current value and gm dropped. The kink phenomena which are troublesome in cryogenic operation, however, disappeared. Thus good static characteristics were obtained.

(ii) Gate Capacitance Measurement

Figure 9:
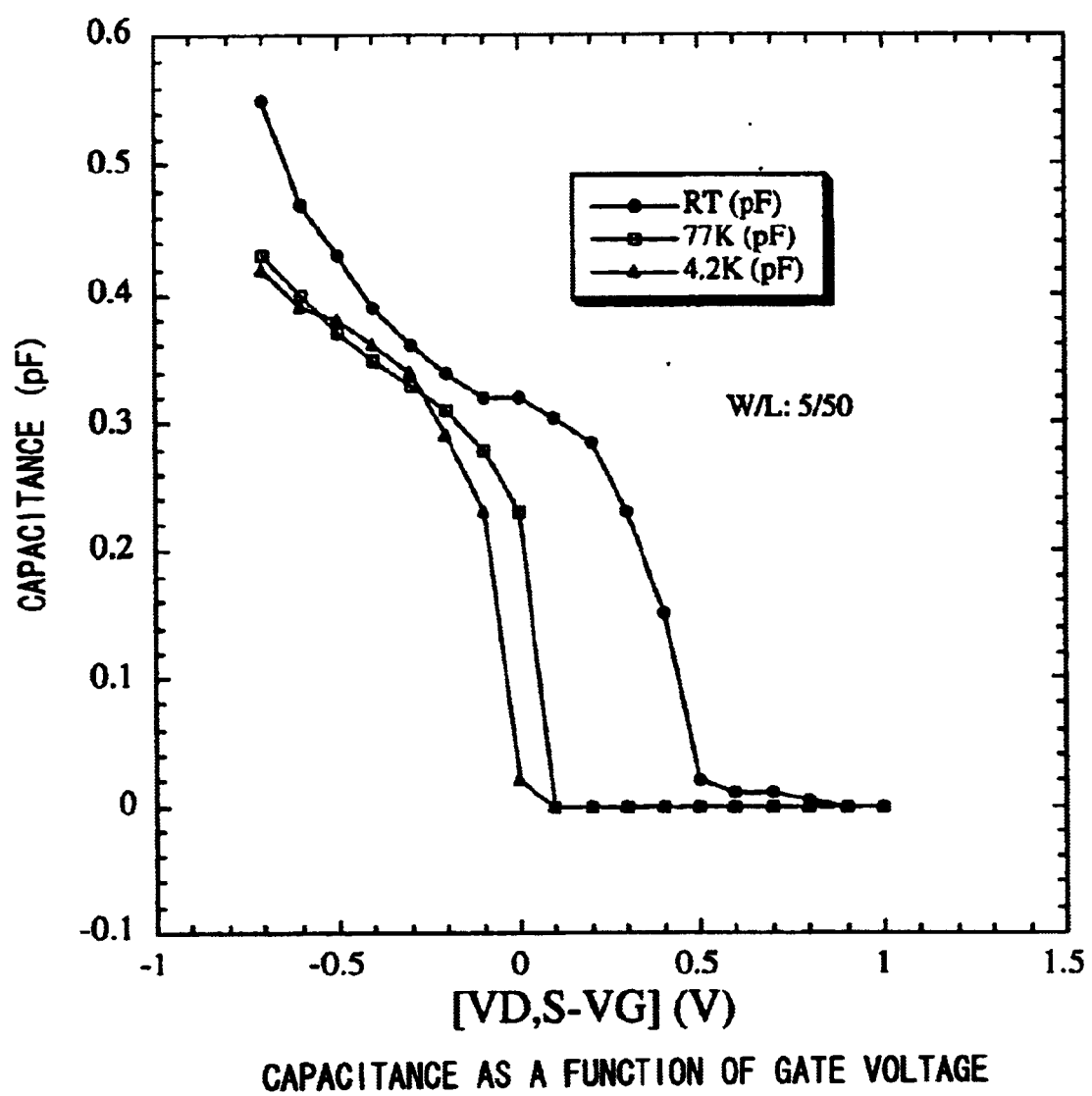
FIG. 9 shows the applied—voltage dependence of capacitance between channel and gate in an embodiment of the present invention.

FIG. 9 is a diagram showing the dependence on gate voltage of the channel-gate capacitance. In FIG. 9, the abscissa represents VD, S-VG (V), and the ordinate represents capacitance (pF). The channel-gate capacitance was measured by shunting the drain and source of the GaAs J-FET.

The sample was cooled from room temperature to 4.2 K in the PPMS 3 (see FIG. 2), as in the case of the measurement of static characteristics, as described above. The measuring terminal was connected to the "4280A CV plotter" manufactured by Hewlett-Packard (HP). The capacitance was measured while applying gate voltage. FIG. 9 shows the capacitance at element temperatures of room temperature, 77 K and 4.2 K.

When a reverse bias voltage is applied to a p-n junction formed by a gate region and a source-drain region, the channel disappears, and as a result, there can be a certain capacitance beyond which the capacitance no longer changes even if a further higher reverse-bias voltage is applied. The capacitance is regarded as 0 pF. FIG. 9 shows characteristics of the capacitance to the bias voltage obtained by regarding the aforementioned capacitance value as 0 pF and subtracting from it the stray capacitance of the measuring system. FIG. 9 reveals that the capacitance of the GaAs J-FET in normal operating condition is 0.3~0.4 pF and lower than that of the MOSFET, etc. (more than 1 pF).

(iii) Noise Characteristics at Cryogenic Temperatures

When detecting feeble light, a readout circuit of a type integrating out put carriers is often used to improve the signal-noise ratio. In the circuit, an important characteristic in evaluating the system performance is a noise level in the low-frequency region in the FET. Well-known noise at low frequencies includes 1/f noise, G-R noise, etc. The random telegraph signal (RTS) that has not yet been fully elucidated has to be considered also.

The noise is measured using a noise measuring circuit shown in FIG. 2. After the drain voltage had been determined, the drain current was determined from the source voltage and the resistance Rs, and the gate voltage was given via the resistance $R_1$ and resistance $R_2$. A feedback loop is formed from the out put of operational amplifier 2 to the gate of the transistor 1 through a resistance $R_1$, and the gain of operational amplifier 2 is 11-fold. An input of the operational amplifier is the out put of the source follower circuit.

Figure 10:
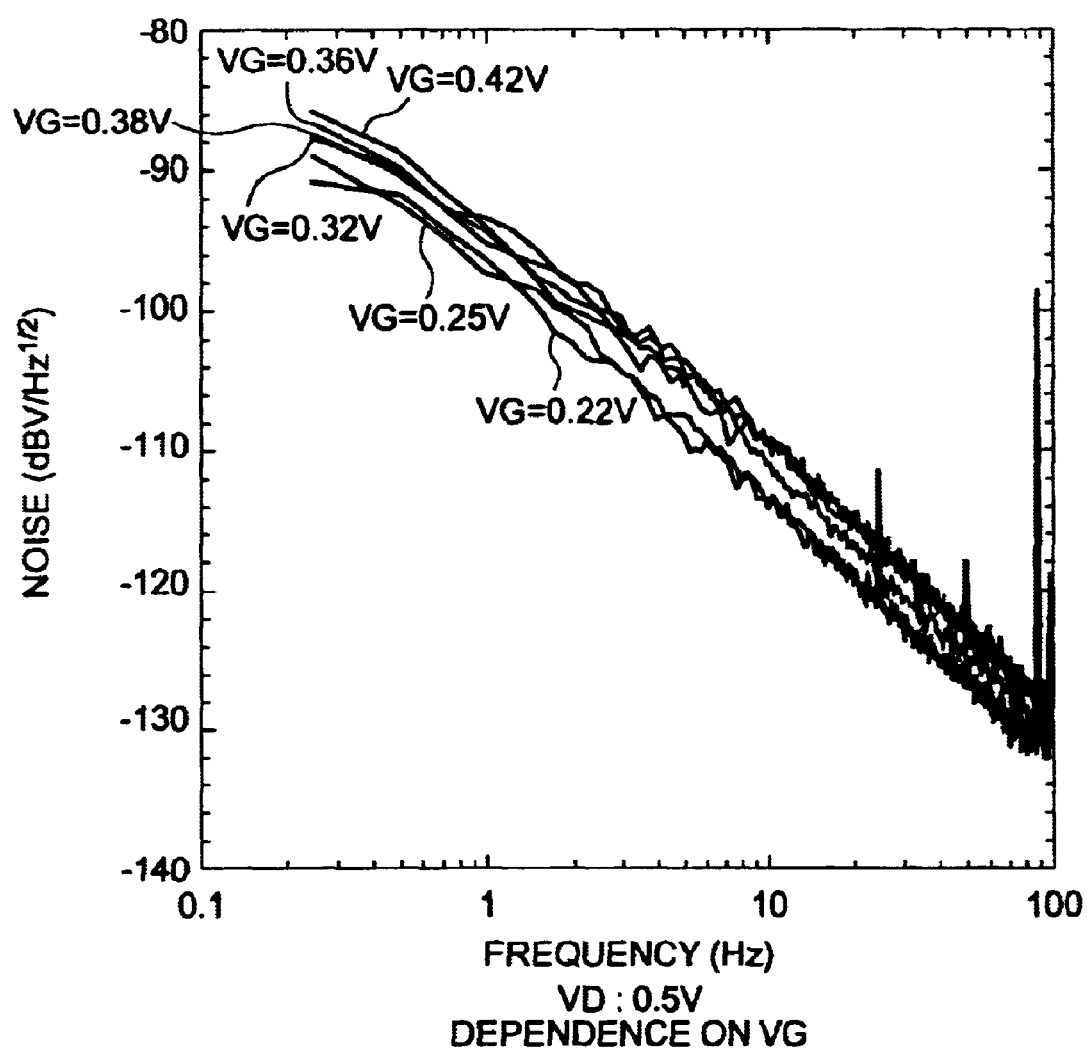
FIG. 10 shows noise characteristics at 4.2 K in an embodiment of the present invention.

Thus the gate input referred noise was obtained from dividing the Vout by the source follower gain and the operational amplifier gain. FIG. 10 shows noise characteristics when an FET was operated at 4.2 K. In FIG. 10, the abscissa represents frequency (Hz) and the ordinate represents noise (dBV/Hz$^{1/2}$). As is apparent from the figure, noise spectra decreases at the rate of $1/f^2$. It is well known that spectra of the random telegraph signal diminishes at the rate of $1/f^2$. So the observed noise spectra in the low-frequency region indicates that random telegraph signal was remarkable.

Figure 11:
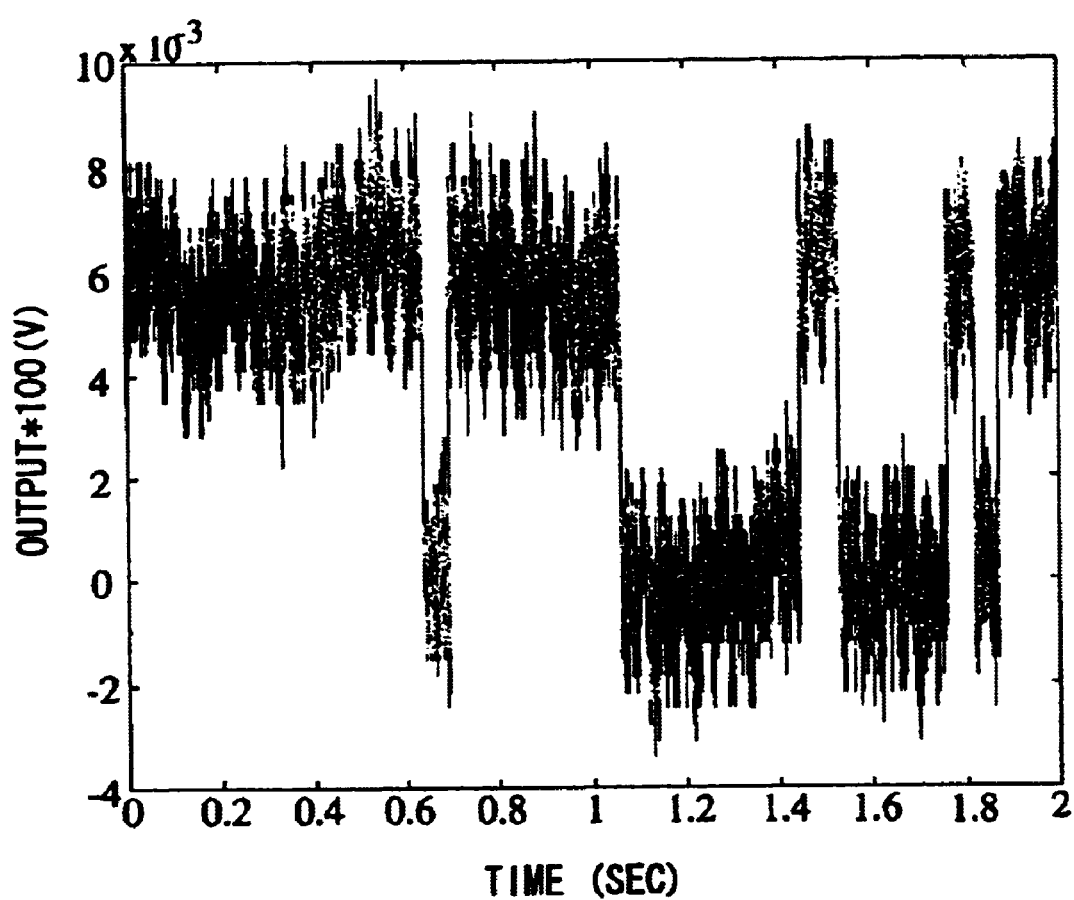
FIG. 11 shows a random telegraph signal waveform in an embodiment of the present invention.

FIG. 11 shows the waveform of random telegraph signal when the FET was operated at the operating temperature of 4.2K, VD=0.5 V, and Id=2 $\mu$A. In FIG. 11, the abscissa represents time (sec) and the ordinate represent output $\times 10^2$ (V). The waveform of random telegraph signal transits features its level changes between two levels as shown in the FIG. 11, and its spectra decrease at the rate of $1/f^2$ as mentioned above.

This transition of the noise level between the two levels is distinguished from the normal G-R noise. From a fact for the conductance fluctuation to be constant, it is generally considered that the transition between the two levels is caused by the conductance fluctuation due to a single electron switching to a trap level. Because of the presence of the noise, the performance of the GaAs J-FET is as 10 $\mu$V/Hz$^{1/2}$ at 1 Hz, thus it is not so advantageous compared with the p-MOSFET used for similar purposes. It is therefore necessary to reduce the generation of the noise.

(iv) Method of Reducing Random Telegraph Signal Noise

The cause of the random telegraph signal is considered to be the transition of carriers to a trap level that affect the channel. The inventors of the present invention consider that the transition to the trap level is caused by tunneling process, not a thermal fluctuation, at cryogenic temperatures.

Figure 12:
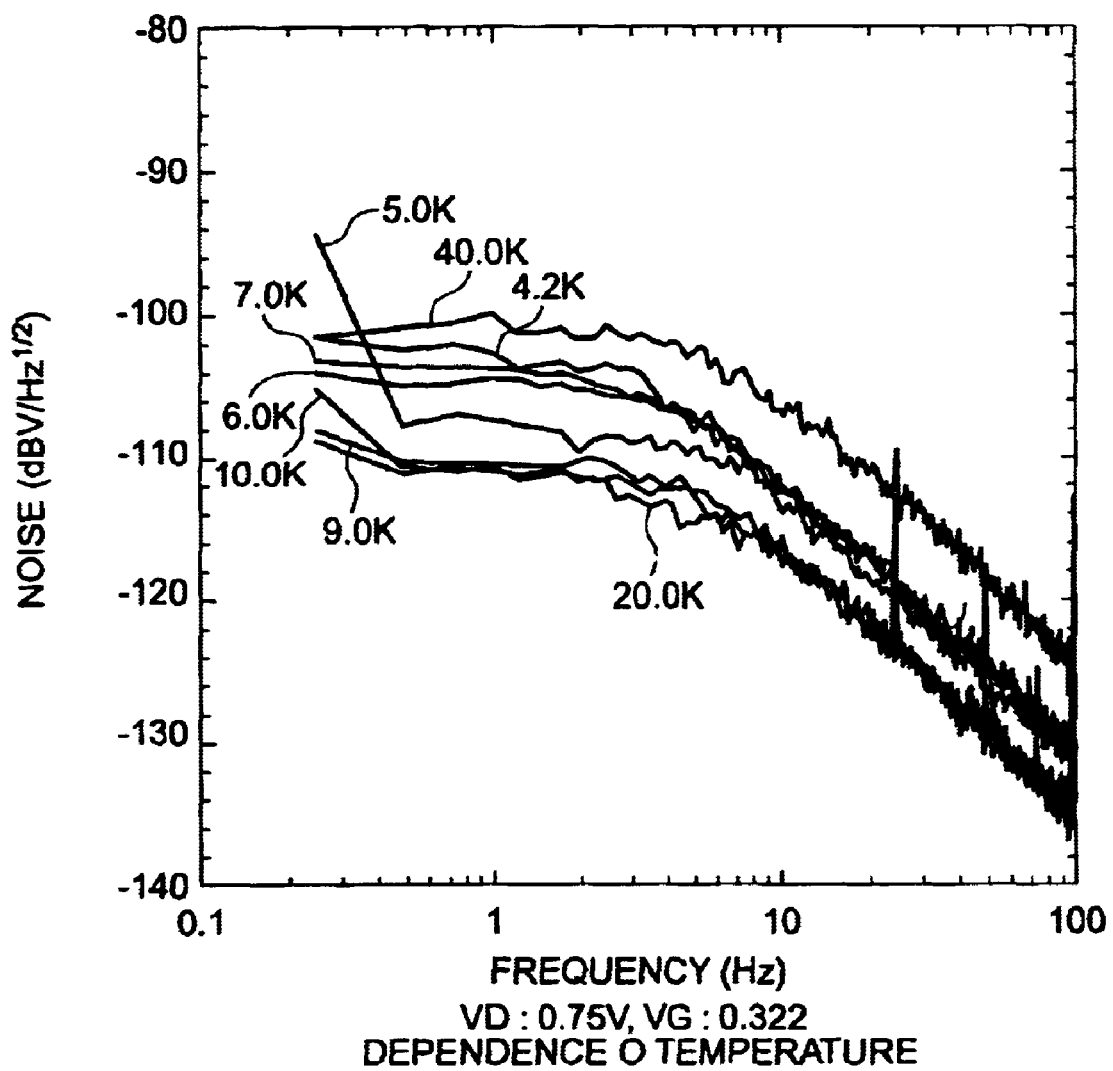
FIG. 12 shows the operating-temperature dependence of noise characteristics in an embodiment of the present invention.

FIG. 12 shows the temperature dependence of operating noise characteristics. The abscissa represents frequency (Hz), and the ordinate represents noise (dBV/Hz$^{1/2}$). As shown in the figure, changes of the time constant of Lorentzian distribution are observed at the element temperatures of 30 K~40 K. In other words, the transition of carrier to the trap is determined by the tunneling process at temperatures lower than 30 K.

When electron tunneling to trap levels is concerned, such tunneling can be prevented by filling the levels by some means. Consequently, the inventors of the present invention tried that the element temperature was temporarily raised up to 55 K while flowing the transistor current at 4.2 K, and then cooled to 4.2 K. This process is hereinafter referred to as thermal cure (TC).

Figure 13:
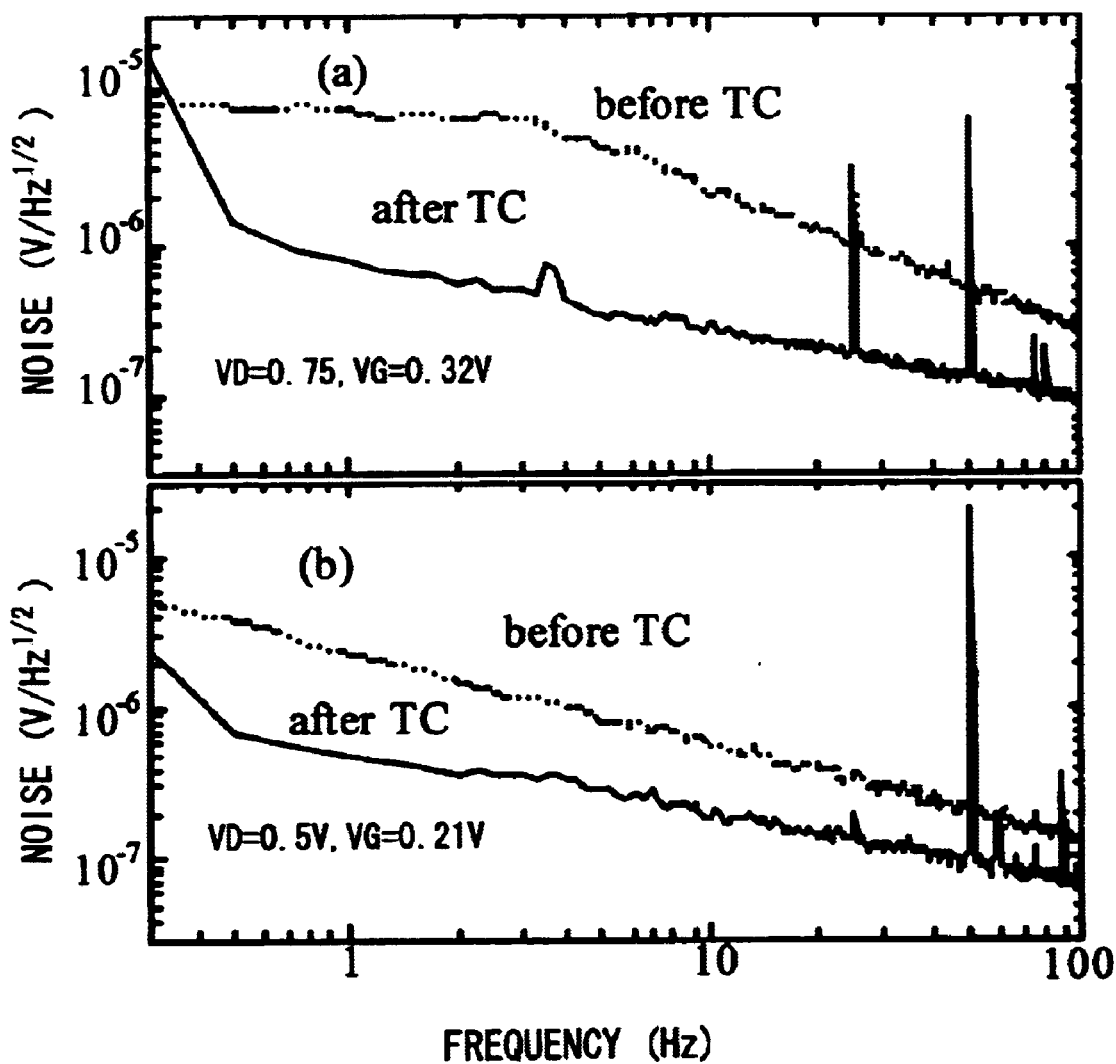
FIG. 13 shows noise spectrum in cases with thermal cure and without thermal cure in an embodiment of the present invention.

FIG. 13 shows the noise characteristics in cases with the thermal cure or without the thermal cure. In FIG. 13 (a) shows a case of VD=0.75V and VG=0.32V, (b) shows another case of VD=0.5V and VG=0.21V. The abscissa representing noise frequency (Hz) and the ordinate represents noise spectrum (dBV/Hz$^{1/2}$). The drain current in the measurement is 1 $\mu$A. The dotted line in FIG. 13 represents the characteristics without the thermal cure and the solid line represents the characteristics with the thermal cure. As shown in FIG. 13, when the thermal cure is carried out, the noise characteristics memorize the hysteresis of changes in the element temperature. That is, when carried out the thermal cure, the noise level is low, however when not carried out the thermal cure, the noise level is high. When the element temperature was temporarily raised while flowing the current in the transistor and cooled down to an operating temperature of 4.2K, the noise was reduced remarkably to 0.5 $\mu$V/Hz$^{1/2}$ at 1 Hz. The following experiments were carried out to confirm the effects of the thermal cure in this phenomenon.

1. To confirm the noise changes for various hours letting the transistor left as it is at 4.2K while flowing the transistor current without the thermal cure.

2. To confirm noise changes for various hours letting the transistor left as it is at 4.2 K after the thermal cure.

The reduction of the noise is expected, when the transition of carrier to the trap level becomes an equilibrium after letting the transistor left as it is for long hours. The experiment 1 was performed to confirm whether the expectation is correct or not. The experiment 2 was performed to confirm the effect of the thermal cure is the noise characteristics in the fully cooled state, not caused from a temporary rise in the lattice temperature, and to confirm whether the deterioration of the noise characteristics is caused or not by letting the element left as it is for long hours after the thermal cure.

Figure 14:
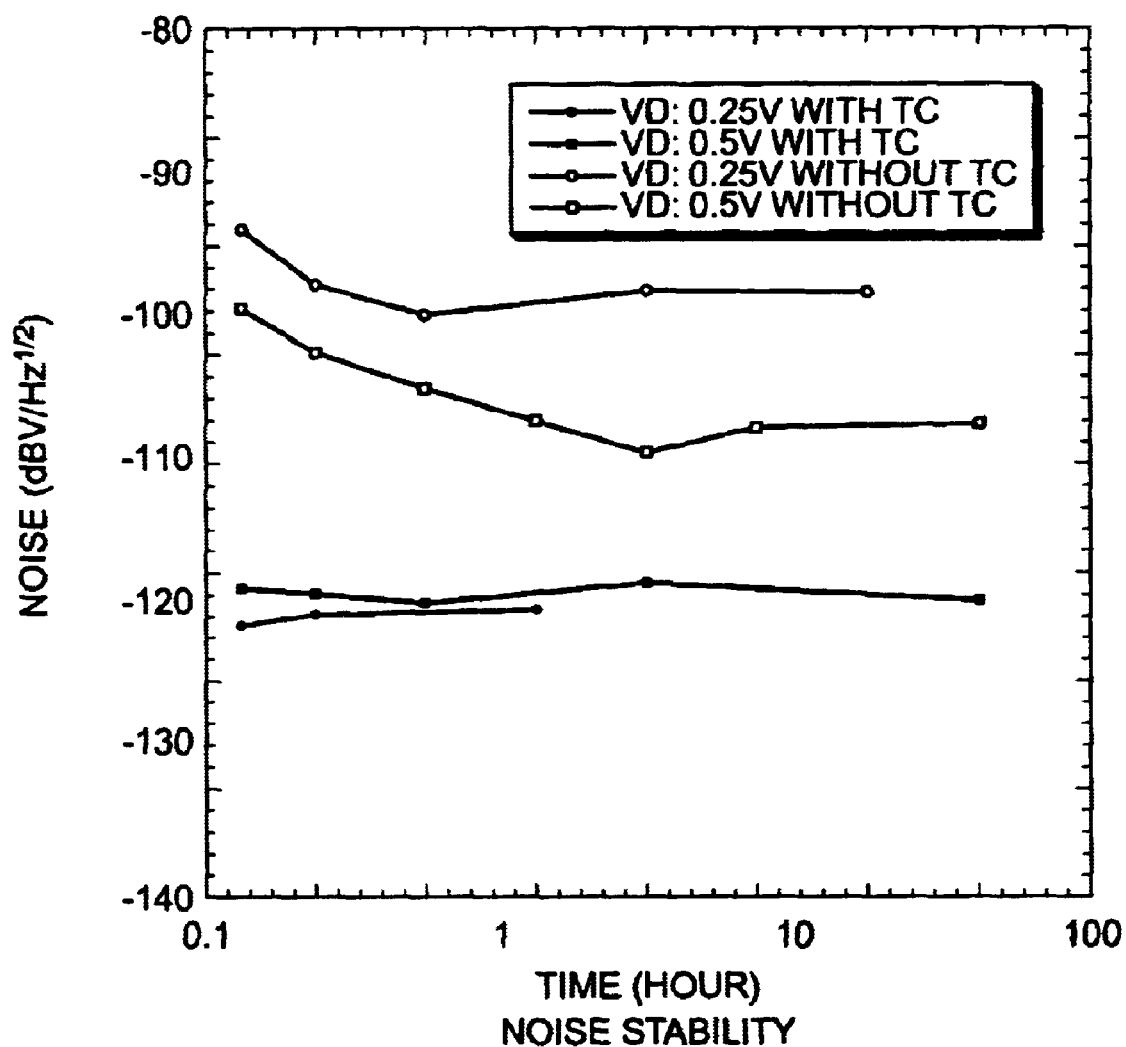
FIG. 14 shows the stability of noise characteristics in an embodiment of the present invention.

FIG. 14 shows the stability of noise characteristics, that is, changes in the noise characteristics of the transistor after letting the transistor left as it is for long hours after the thermal cure and without the thermal cure. The abscissa representing time (hour) and the ordinate represents noise (dBV/Hz$^{1/2}$). In FIG. 14, (a) and (b) show noise characteristics without the thermal cure, while (c) and (d) show those with the thermal cure. The characteristics were measured at the drain current of 1 $\mu$A, and the noise was measured at 1 Hz throughout the measurement. As the VD applied to the transistor, VD=0.5 V belongs to a saturation region, while VD=0.25 V belongs to a linear region.

As is obvious from FIG. 14, the effect of the thermal cure is not due to a temporary rise in the lattice temperature, but the stable characteristics of the noise reduction lasts a few hours after achieving low noise. It was revealed that, letting the transistor left as it is for about three hours even without the thermal cure, the noise level is decreased about 5 dB, but could not be improved to a noise level gained with such a noise reduction as achieved with the thermal cure.

Noise was measured when the drain current was increased to 2 μA by changing VG after the thermal cure. As a result, the noise level could be kept at a low level of 0.5~0.6 μV/Hz$^{1/2}$ at 1 Hz. Similar effects were naturally obtained with a plurality of reticules. Thus, it was confirmed that the thermal cure has a great effect on improvement of the operating characteristics of FETs.

Although the above experiments were conducted at 55 K as the heating temperature in the thermal cure, what degree of heating temperature is actually necessary in the thermal cure was confirmed in the following experiment. That is, the transistor was first cooled to 4.2 K and power to the transistor was turned on. The transistor, further, heated up to the aimed heating temperature at the rate of 10 K/min, and then cooled to 4.2 K again for noise measurement.

Figure 15:
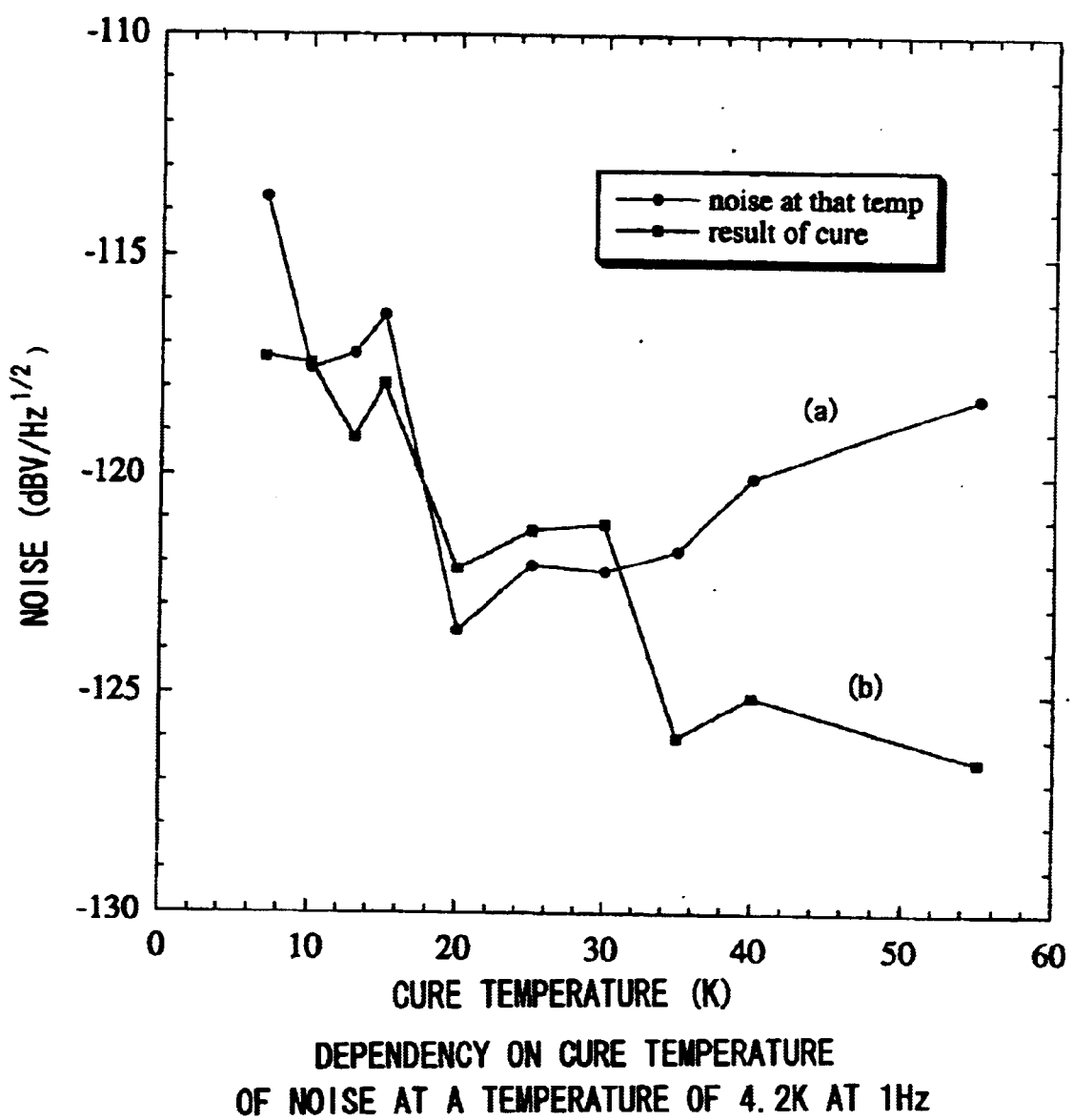
FIG. 15 shows the TC-temperature dependence of noise in an embodiment of the present invention.

FIG. 15 shows the dependence on the thermal cure of the noise level. In FIG. 15, the abscissa represents thermal cure temperature (K) which is raised up temporarily and the ordinate represents noise (dBV/Hz$^{1/2}$). In FIG. 15, (a) shows the noise level at thermal cure temperatures raised up temporarily for the thermal cure, (b) shows the noise level at 4.2 K after the completion of the thermal cure, that is the element was raised to the thermal cure temperature of the abscissas, and cooled to 4.2 K at each measurement.

In FIG. 15, the characteristics was measured on VD=0.5 V, ID=1 μA, and frequency at 1 Hz. As the result of the thermal cure at the thermal cure temperatures lower than 30 K, the noise is decreased, but the noise at the thermal cure temperature also decreases. Thus it cannot be concluded that the noise reduction is as the effect of the thermal cure alone. In other words, it could be that the noise reduction is caused from the effect of letting the transistor left as it is after the thermal cure like shown in FIG. 14.

At the thermal cure temperatures above 35 K, however, the spread between the noise at the thermal cure temperature and the noise after thermal cure becomes larger. The noise reduction seems to be based on the effect of thermal cure between 30 K and 35 K. Thus, it can be concluded that the conspicuous effect of thermal cure arises from the vicinity of 35 K.

The aforementioned effect of the thermal cure contributes basically to the elimination of RTS noise. Judging from the fact that the deterioration of noise characteristics did not occur, even the gate voltage is changed after the thermal cure, the effect of the thermal cure seems not to be caused from the traps within the channel. Considering the fluctuation size in conductance and judging from the fact where a modulation as much as about ⅟1000 of the current was caused, however, it is reasonable that the effect of the thermal cure is caused from the coulomb force in the vicinity of the depletion region.

GaAs J-FETs have an excellent performance such as good static characteristics, low capacitance and high gate resistance in operations with low drain currents. As to noise characteristics, low noise was realized with the FET of various gate sizes by using the thermal cure.

In other words, GaAs J-FETs have a potential to be applied to impedance conversion circuits of low power, low leak current, and low noise. GaAs J-FETs, which has better performance than the Si MOS or MES-FET, will suit for application to a readout circuit for a cryogenic sensor used in a high-impedance state.

Figure 16A:
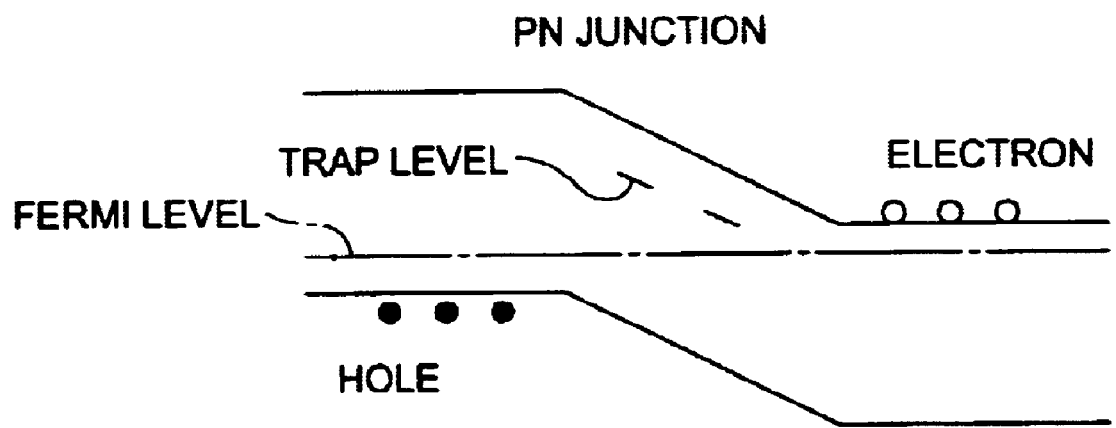
FIG. 16A is a diagram of p-n junction model before thermal cure in the present invention.
Figure 16B:
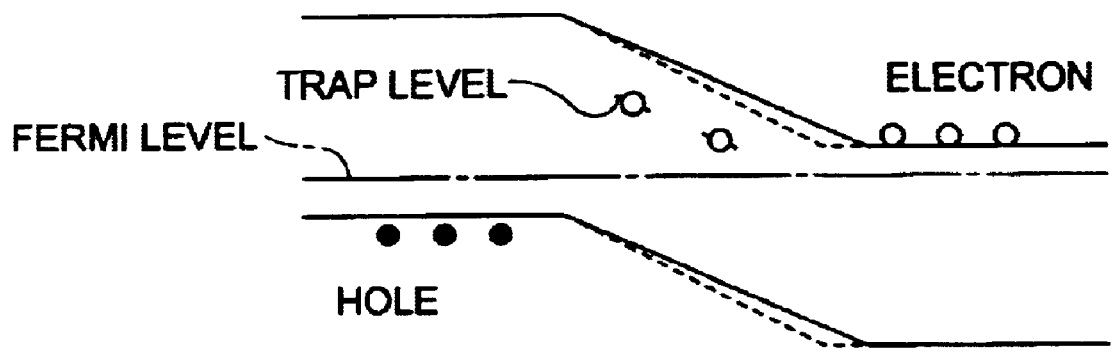
FIG. 16B is a diagram of p-n junction model after thermal cure in the present invention.
Figure 17A:
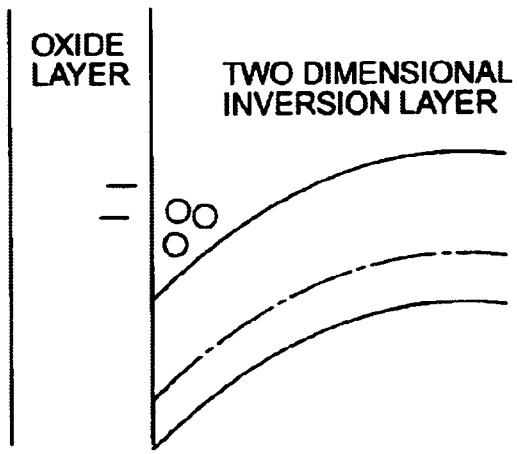
FIG. 17A shows is a diagram explaining charge trap at a channel region in MOSFET before the thermal cure in the present invention.
Figure 17B:
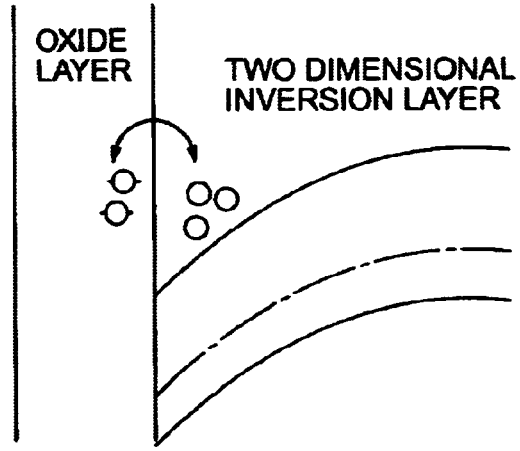
FIG. 17B shows is a diagram explaining charge trap at a channel region in MOSFET after the thermal cure in the present invention.

Now, the thermal cure will be described in detail. FIG. 16A is a diagram of pn junction model before thermal cure in the present invention. FIG. 16B is a diagram of p-n junction model after thermal cure in the present invention. FIG. 17A shows a diagram explaining charge trap at a channel region in MOSFET before the thermal cure in the present invention. FIG. 17B shows a diagram explaining charge trap at a channel region in MOSFET after the thermal cure in the present invention.

(4) General Explanation of the Noise Reduction Effect of the Thermal Cure As mentioned above, the thermal cure is effective, when the transistor is used at low temperatures that the transition of carrier to a trap is determined by the tunneling process. As shown in FIG. 16A and FIG. 16B, physical interpretation of the thermal cure is that the physical distance between the channel region and the trap is increased because of the potential change caused with the carriers trapped (or switched) to a trap level. Consequently, the switching frequency of carriers by the tunneling effect is lowered.

This process is considered that it happens in the presence of the random telegraph signal. The thermal cure affects for the carriers to fill the trap in the entire channel, and the carrier trapping may smooth the potential interface. In the following, this is described in detail, referring to the figures.

In a p-n junction as shown in FIG. 16A, when the element temperature is raised, while applying a current, to a temperature at which the transition of carriers to the trap is determined by a thermal process, electrons are transferred to the trap as shown in FIG. B. As the result, the carriers trapping causes the potential change of the p-n junction thereby.

In other words, as the physical distance between the trap location and the channel carrier location is increased, then the switching rate of carriers is reduced. The thermal cure plays a role of filling the traps over the entire channel, which results in reducing RTSs, that is the noise reduction.

(5) Thermal Cure in MOS-FETs

FIGS. 17A and 17B are diagrams explaining a carrier trap in a MOSFET. FIG. 17A shows a state before the thermal cure and FIG. 17B shows a state after the thermal cure. Traps in a MOSFET exist in the vicinity of an interface with the oxide layer, as shown in FIGS. 17A and 17B. As explained in the case of the p-n junction shown in FIG. 16A and FIG. 16B, the transistor is temporarily heated to a temperature at which the switching process is determined by thermal fluctuations, and then cooled to a temperature at which the tunnel process becomes dominant (while the current is kept flowing) in the present invention. In the case of the MOSFET, too, the transition probability to the trap by the tunneling effect is remarkably lowered, and noise is reduced since the distance between the trap and the channel is physically increased as is the case of the aforementioned p-n junction.

(6) Summary of Physical Interpretation of the Thermal Cure

The thermal cure is applied to a transistor operating at low temperatures where the transition of carriers to the traps is determined by the tunnel process. After carriers have been switched to the trap levels, the potential is changed to increase the physical distance between the channel region and the trap location. Consequently, the switching of carriers by tunneling reduces the switching frequency.

This process is considered that it happens in the presence of the random telegraph signal. The thermal cure affects for the carriers to fill the trap in the entire channel, and the carrier trapping may smooth the potential interface. Transistors operating at cryogenic temperatures include Si MOS-FETs (both of n-channel and p-channel), Si J-FETs and other similar elements like other compound semiconductor devices in addition to the aforementioned GaAs J-FETs. The thermal cure temperature of the devices, however, may differ from the GaAs J-FETs.

Figure 18:
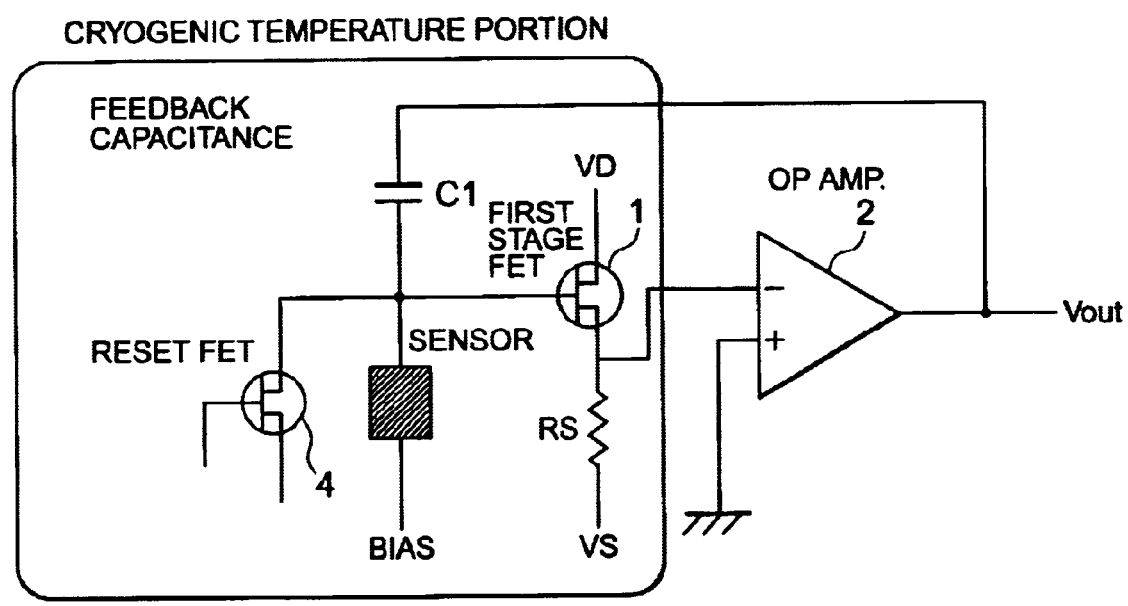
FIG. 18 shows an application of a cryogenic FET in an embodiment of the present invention.

Now, applications of cryogenic FETs will be described in the following. FIG. 18 shows a circuit in which a cryogenic FET is applied. The circuit is an example where the cryogenic FET is applied to a capacitive trans-impedance amplifier (CTIA) for a feeble light sensor. This feeble light sensor needs to be cooled to cryogenic temperatures to prevent thermal carrier excitation and background radiation causing noise.

The sensor, which is generally a high impedance, needs to provide an impedance conversion circuit using a FET. Both the sensor and the FET1 should preferably be operated at the same operating temperature to prevent external noise and heat influx. In FIG. 18, impedance conversion is carried out by the first stage FET 1. The performance of this FET 1 therefore predominantly determines the performance of a readout circuit.

Figure 19:
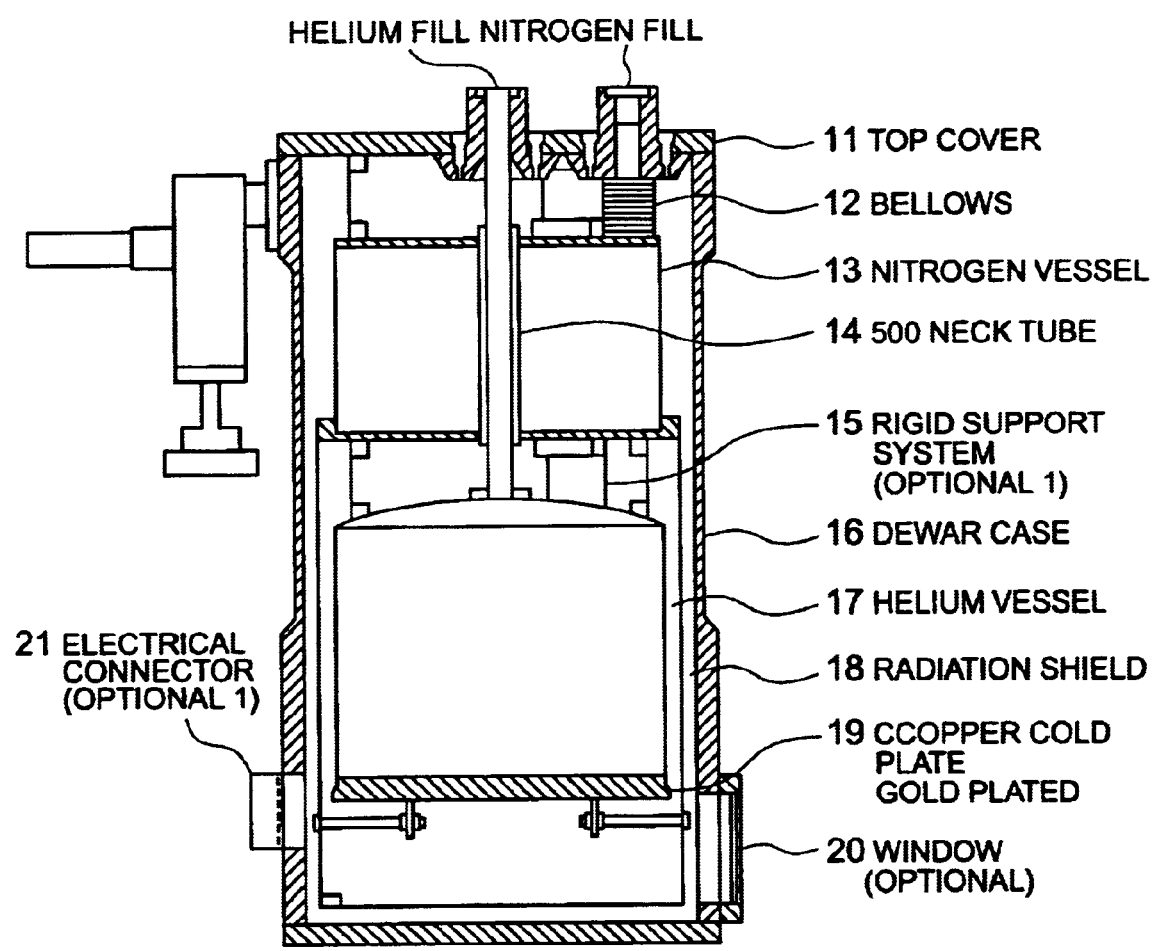
FIG. 19 shows an example of the cryostat in an embodiment of the present invention.
Figure 20A:
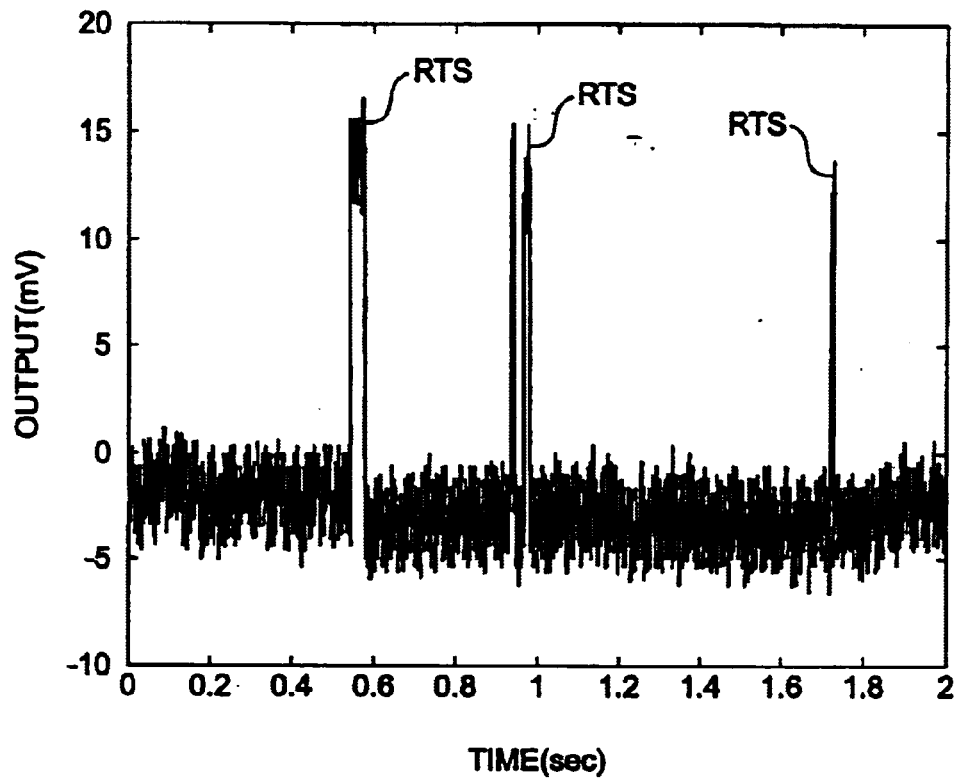
FIG. 20A shows an output waveform of a GaAs J-FET in prior art.
Figure 20B:
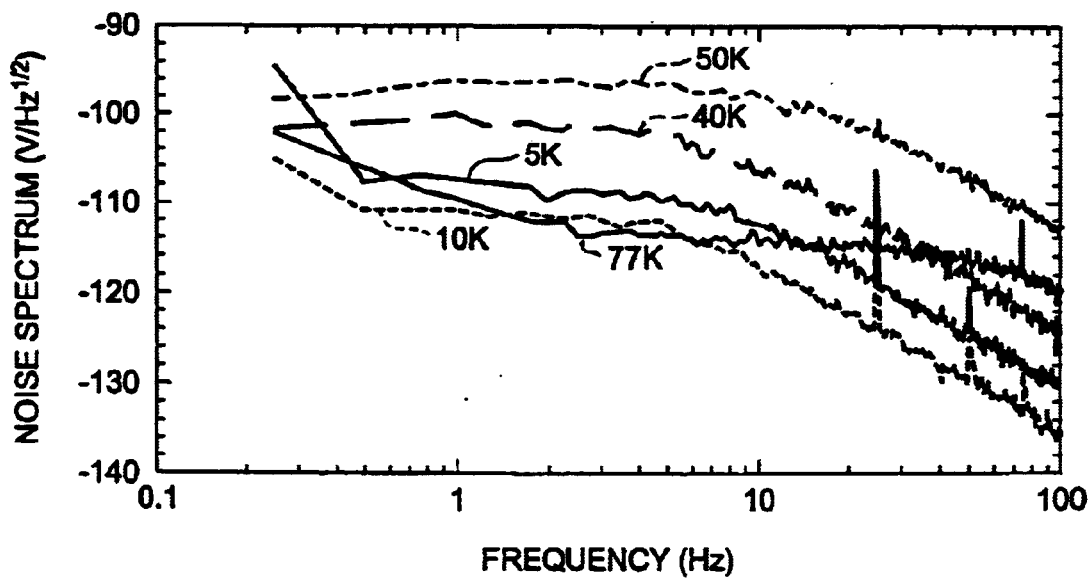
FIG. 20B is the temperature dependence of noise spectra in a GaAs J-FET in prior art.

Now, the cryostat is described. FIG. 19 shows a typical cryostat. In FIG. 19, reference numeral 11 refers to a top cover, 12 to a bellows, 13 to a nitrogen vessel, 14 to a neck tube, 15 to a support member, 16 to a double-walled case, 17 to a helium vessel, 18 to a radiation shield, 19 to a copper cold plate, 20 to a window, and 21 to a connector, respectively.

This cryostat is used by injecting liquid helium. The copper cold plate 19 shown in the figure is cooled down to the liquid helium temperature. The light sensor and the readout circuit are fixed on the copper cold plate 19 to detect the light guided through the window 20.

Although the present invention has been described by reference to a GaAs J-FET in the above description, the present invention also holds true with MOS FETs, bipolar transistors with p-n junctions or another compound semiconductor devices. According to the present invention, low-frequency noise in a transistor can be positively reduced with a simple method, that is, turning on a transistor in a cryostat at a first temperature to bring the transistor into the operating state, and subjecting the transistor to thermal cure while the current is kept flowing.

The many features and advantages of the present invention are apparent from the detailed specification and, thus, it is intended by the appended claims to cover all such features and advantages of the invention which fall within the true spirit and scope of the invention. Further, since numerous modification and changes will readily occur to those skilled in the art, it is not desired to limit the invention to the exact construction and operation illustrated and described, and accordingly all suitable modification and equivalents falling within the scope of the invention may be included in the present invention.

What is claimed is:

1. A method that reduces low-frequency noise in a circuit comprising a semiconductor device, where the semiconductor device is housed in a cooling-temperature adjustable cryostat, comprising:

a first step of turning on the semiconductor device at a first temperature, and temporarily raising the temperature of the semiconductor device, while flowing current in the semiconductor device, to a second temperature that is higher than the first temperature, following the first step, a second step of cooling the temperature of the semiconductor device from the second temperature to a cryogenic temperature, and operating the semiconductor device at the cryogenic temperature.

2. A method that reduces low-frequency noise in a circuit as set forth in claim 1, wherein the second temperature is a temperature at which the noise spectrum has operating-temperature dependency and the first temperature is a cryogenic temperature at which temperature the semiconductor device can operate.

3. A method that reduces low-frequency noise in a circuit as set forth in claim 1, wherein the circuit is a read out circuit.

4. A method that reduces low-frequency noise in a circuit as set forth in claim 1, wherein the semiconductor device is a junction field-effect transistor.

5. A method that reduces low-frequency noise in a circuit as set forth in claim 1, wherein the semiconductor device is a bipolar transistor.

6. A method that reduces low-frequency noise in a circuit as set forth in claim 1, wherein the semiconductor device is a MOS field-effect transistor.

7. A method that reduces low-frequency noise in a semiconductor device operating in a cryogenic temperature comprising:

a first step of turning on the semiconductor device at a first temperature, and temporarily raising the temperature of the semiconductor device, while flowing the current in the semiconductor device, to a second temperature that is higher than the first temperature, following the first step, a second step of cooling the temperature of the semiconductor device from the second temperature to a low temperature of cryogenic temperature, and operating the semiconductor device at the low temperature.

8. A method that reduces low-frequency noise in a semiconductor device operating in a cryogenic temperature set forth in claim 7, wherein the second temperature is a temperature at which the noise spectrum has operating-temperature dependency and the first temperature is a cryogenic temperature at which temperature the semiconductor device can operate.

9. A method that reduces low-frequency noise in a semiconductor device operating in a cryogenic temperature as set forth in claim 7, wherein the semiconductor device is a junction field-effect transistor.

10. A method that reduces low-frequency noise in a semiconductor device operating in a cryogenic temperature as set forth in claim 7, wherein the semiconductor device is a bipolar transistor.

11. A method that reduces low-frequency noise in a semiconductor device operating in a cryogenic temperature as set forth in claim 7, wherein the semiconductor device is a MOS-gate field-effect transistor.

* * * * *

UNITED STATES PATENT AND TRADEMARK OFFICE
CERTIFICATE OF CORRECTION

PATENT NO. : 6,773,936 B2
DATED : August 10, 2004
INVENTOR(S) : Mikio Fujiwara et al.

It is certified that error appears in the above-identified patent and that said Letters Patent is hereby corrected as shown below:

Title page,
Item [56], References Cited, U.S. PATENT DOCUMENTS, please add
-- 6,263,215    7/2001       Patton et al.           455/561
   5,258,710    11/1993      Black et al.            324/309
   4,868,902    9/1989       Sato, Robert N.         250/332 --.
OTHER PUBLICATIONS, please add
-- T. Judd et al. "Observation Of Discrete Resistance Levels In Large Area Graded Gap Diodes At Low Temperatures Appl. Phys. Lett. 49(24), 1652 (15 December 1986). --

Signed and Sealed this

Fourth Day of January, 2005

JON W. DUDAS
*Director of the United States Patent and Trademark Office*